Nov. 13, 1923. Re. 15,724

R. F. SCHUCHARDT

METER

Original Filed July 5, 1919 7 Sheets-Sheet 1

Inventor:
Rudolph Frederick Schuchardt
by Alexander S. Lunt
His Attorney.

Nov. 13, 1923. Re. 15,724

R. F. SCHUCHARDT

METER

Original Filed July 5, 1919 7 Sheets-Sheet 2

Inventor:
Rudolph Frederick Schuchardt,
by Alexander S. Lunt
His Attorney.

Nov. 13, 1923. Re. 15,724

R. F. SCHUCHARDT

METER

Original Filed July 5, 1919 7 Sheets-Sheet 3

Inventor:
Rudolph Frederick Schuchardt,
by Alexander S. Lane
His Attorney.

Nov. 13, 1923. Re. 15,724

R. F. SCHUCHARDT

METER

Original Filed July 5, 1919 7 Sheets-Sheet 4

Fig. 5.B.

Inventor:
Rudolph Frederick Schuchardt,
by Alexander S. Lent
His Attorney.

Nov. 13, 1923. Re. 15,724
R. F. SCHUCHARDT
METER
Original Filed July 5, 1919 7 Sheets-Sheet 5
Fig. 7.
| | | | | | | | | | |
|---|---|---|---|---|---|---|---|---|---|
| 9 | 8 | 7 | 6 | 5 | 4 | 3 | 2 | 1 | 0 |
| 9.05 | 8.07 | 7.08 | 6.09 | 5.10 | 4.13 | 3.16 | 2.24 | 1.41 | 1 |
| 9.22 | 8.39 | 7.29 | 6.33 | 5.39 | 4.48 | 3.61 | 2.83 | 2.24 | 2 |
| 9.50 | 8.55 | 7.62 | 6.82 | 5.84 | 5.00 | 4.25 | 3.61 | 3.16 | 3 |
| 9.86 | 8.95 | 8.07 | 7.22 | 6.41 | 5.66 | 5.00 | 4.48 | 4.13 | 4 |
| 10.31 | 9.45 | 8.60 | 7.82 | 7.08 | 6.41 | 5.84 | 5.39 | 5.10 | 5 |
| 10.83 | 10.00 | 9.22 | 8.50 | 7.82 | 7.22 | 6.82 | 6.33 | 6.09 | 6 |
| 11.40 | 10.66 | 9.91 | 9.22 | 8.60 | 8.07 | 7.62 | 7.29 | 7.08 | 7 |
| 12.06 | 11.36 | 10.65 | 10.00 | 9.45 | 8.95 | 8.55 | 8.39 | 8.07 | 8 |
| 12.96 | 12.06 | 11.40 | 10.83 | 10.31 | 9.86 | 9.50 | 9.22 | 9.05 | 9 |
Fig. 8.
| | | | | | | | | | | |
|---|---|---|---|---|---|---|---|---|---|---|
| 10 | 9 | 8 | 7 | 6 | 5 | 4 | 3 | 2 | 1 | 0 |
| 0 | 0 | 0 | 0 | 0 | 0 | 0 | 0 | 0 | 0 | 0 |
| 0 | 0 | 0 | 0 | 0 | 0 | 0 | 0 | 0 | 0 | 0 |
| 10.05 | 9.05 | 8.07 | 7.08 | 6.09 | 5.10 | 4.13 | 3.16 | 2.24 | 1.41 | 1 |
| 9.98 | 11.0 | 12.3 | 14.1 | 16.5 | 19.4 | 24.1 | 31.7 | 44.6 | 70.7 | 100 |
| 1 | 1 | 1 | 1 | 1 | 1 | 1 | 1 | 1 | 1 | 1 |
| 10.20 | 9.22 | 8.39 | 7.29 | 6.33 | 5.39 | 4.08 | 3.61 | 2.83 | 2.24 | 2 |
| 19.4 | 21.6 | 24.1 | 27.3 | 31.7 | 37.2 | 44.6 | 55.4 | 70.7 | 89.4 | 100 |
| 2 | 2 | 2 | 2 | 2 | 2 | 2 | 2 | 2 | 2 | 2 |
| 10.45 | 9.50 | 8.55 | 7.62 | 6.82 | 5.84 | 5.00 | 4.25 | 3.61 | 3.16 | 3 |
| 28.7 | 31.7 | 35.0 | 39.4 | 44.6 | 51.5 | 59.9 | 70.7 | 83.2 | 94.9 | 100 |
| 3 | 3 | 3 | 3 | 3 | 3 | 3 | 3 | 3 | 3 | 3 |
| 10.78 | 9.86 | 8.95 | 8.07 | 7.22 | 6.41 | 5.66 | 5.00 | 4.48 | 4.13 | 4 |
| 37.2 | 40.5 | 44.6 | 49.5 | 55.4 | 62.4 | 70.7 | 80.0 | 89.4 | 97.5 | 100 |
| 4 | 4 | 4 | 4 | 4 | 4 | 4 | 4 | 4 | 4 | 4 |
| 11.20 | 10.31 | 9.45 | 8.60 | 7.82 | 7.08 | 6.41 | 5.84 | 5.39 | 5.10 | 5 |
| 44.6 | 48.5 | 53.0 | 58.0 | 63.9 | 70.7 | 78.0 | 85.7 | 92.8 | 98.0 | 100 |
| 5 | 5 | 5 | 5 | 5 | 5 | 5 | 5 | 5 | 5 | 5 |
| 11.69 | 10.83 | 10.00 | 9.22 | 8.50 | 7.82 | 7.22 | 6.82 | 6.33 | 6.09 | 6 |
| 52.5 | 55.4 | 59.9 | 65.1 | 70.7 | 76.8 | 83.2 | 89.4 | 94.9 | 98.6 | 100 |
| 6 | 6 | 6 | 6 | 6 | 6 | 6 | 6 | 6 | 6 | 6 |
| 12.20 | 11.40 | 10.63 | 9.91 | 9.22 | 8.60 | 8.07 | 7.62 | 7.29 | 7.08 | 7 |
| 57.3 | 61.3 | 65.9 | 70.7 | 75.9 | 81.3 | 86.8 | 91.9 | 96.2 | 99.0 | 100 |
| 7 | 7 | 7 | 7 | 7 | 7 | 7 | 7 | 7 | 7 | 7 |
| 12.81 | 12.06 | 11.36 | 10.65 | 10.00 | 9.45 | 8.95 | 8.55 | 8.39 | 8.07 | 8 |
| 62.4 | 66.4 | 70.7 | 76.2 | 80.0 | 84.8 | 89.4 | 93.6 | 97.0 | 99.2 | 100 |
| 8 | 8 | 8 | 8 | 8 | 8 | 8 | 8 | 8 | 8 | 8 |
| 13.40 | 12.96 | 12.06 | 11.40 | 10.83 | 10.31 | 9.86 | 9.50 | 9.22 | 9.05 | 9 |
| 66.9 | 70.7 | 74.7 | 78.9 | 83.2 | 87.4 | 91.4 | 94.9 | 98.1 | 99.4 | 100 |
| 9 | 9 | 9 | 9 | 9 | 9 | 9 | 9 | 9 | 9 | 9 |
Fig. 9.
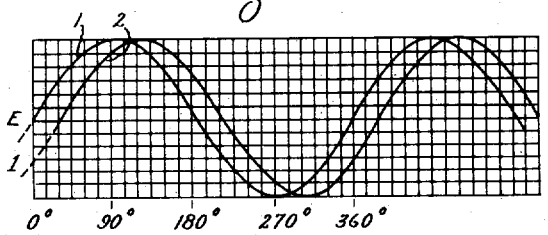
Fig. 10.
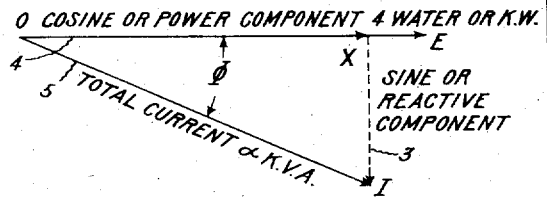
Fig. 11.
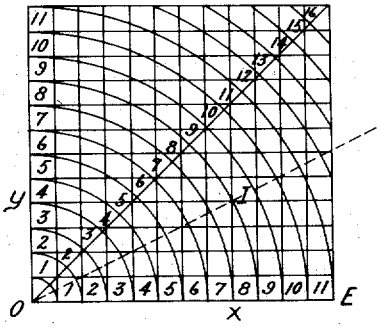
Fig. 8A.
| | | | | | | | | | | |
|---|---|---|---|---|---|---|---|---|---|---|
| | | | | | 5 | 4 | 3 | 2 | 1 | 0 |
| K.V.A. | 11.20 | 10.31 | 9.45 | 8.60 | 7.82 | 7.08 | 6.41 | 5.84 | 5.39 | 5.10 | 5 |
| P.F. | 49.6 | 48.5 | 53.0 | 58.0 | 63.9 | 70.7 | 78.0 | 85.7 | 92.8 | 98.0 | 100 |
| K.W. | 5 | 5 | 5 | 5 | 5 | 5 | 5 | 5 | 5 | 5 | 5 |
| R.C. | 10 | 9 | 8 | 7 | 6 | 5 | 4 | 3 | 2 | 1 | 0 |
| | 11.69 | 10.83 | 10.00 | 9.72 | 8.80 | 7.82 | 7.22 | 6.82 | 6.33 | 6.09 | 6 |
| | 51.5 | 55.4 | 59.9 | 65.1 | 70.7 | 76.8 | 83.2 | 89.4 | 94.9 | 98.6 | 100 |
Inventor:
Rudolph Frederick Schuchardt,
by Alexander S. Lane.
His Attorney.

Nov. 13, 1923. Re. 15,724

R. F. SCHUCHARDT

METER

Original Filed July 5, 1919 7 Sheets-Sheet 6

Inventor:
Rudolph Frederick Schuchardt,
by Alexander S. Lamb
His Attorney.

R. F. SCHUCHARDT
METER
Original Filed July 5, 1919 7 Sheets-Sheet 7
Fig. 13.
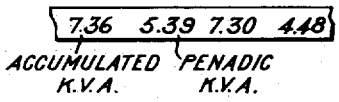
Fig. 14.
| | | | |
|---|---|---|---|
| K.V.A. 7.36 | 5.39 | 7.30 | 4.48 |
| P.F. | 928 | | 89.4 |
| K.W. 6.50 | 5. | 6.45 | 4. |
Fig. 15.
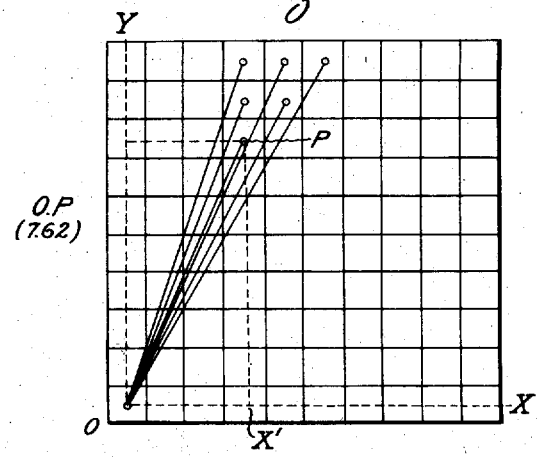
Fig. 16.
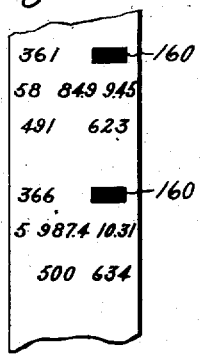
Fig. 17.
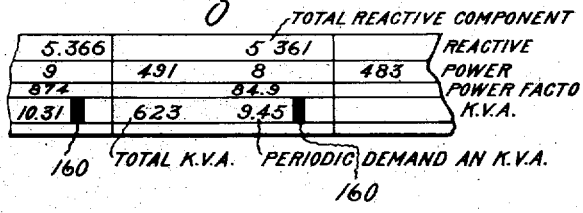
Inventor:
Rudolph Frederick Schuchardt,
by Alexander S. Lunt
His Attorney.

Reissued Nov. 13, 1923. Re. 15,724

UNITED STATES PATENT OFFICE.

RUDOLPH F. SCHUCHARDT, OF CHICAGO, ILLINOIS, ASSIGNOR TO GENERAL ELECTRIC COMPANY, A CORPORATION OF NEW YORK.

METER.

Original No. 1,370,161, dated March 1, 1921, Serial No. 308,706, filed July 5, 1919. Application for reissue filed May 3, 1923. Serial No. 636,452.

*To all whom it may concern:*

Be it known that I, RUDOLPH F. SCHUCHARDT, a citizen of the United States, residing at Chicago, in the county of Cook and State of Illinois, have invented a certain new and useful Improvement in Meters, of which the following is a full, clear, concise, and exact description, reference being had to the accompanying drawings, forming a part of this specification.

My invention relates to meters. The consumer of electric power is charged in general upon the broad basis of the service which he requires from the central station. The primary measure of the charge is based on the amount of power used, but this has generally not been considered representative of the service which he obtains, and other items have been taken into account. One of these items involves the rate at which the power is drawn or the demand that he makes upon the central station. Another item that is generally taken into account in the case of alternating current systems is the character of the current that is drawn, which is described in terms of power factor.

Hence, taking the above items into account, it would be desirable to have means for determining, indicating, and recording the following quantities:

1. The total amount of power drawn either in kilowatts or kilovolt amperes.

2. The average power factor at which the load is drawn, and

3. The maximum demand in terms of kilowatts or kilovolt amperes for a typical period such as a half hour.

With regard to the first and third points, it would be desirable to have the meter record both in KW as well as in KVA. In the same manner it is desirable to record the maximum demand in terms of KVA as well as in KW.

In my copending reissue application filed concurrently herewith and assigned to the same assignee as the present invention, I have shown mechanism and a method of recording the total amount of power drawn in terms of KW, the average power factor at which it is drawn and the maximum demand in terms of KW.

In order to form a correct estimate of the nature of the load it is necessary to combine the power factor with the KW load in order to fix a proper charge.

Heretofore, no suitable means has been provided for measuring total KVA or for measuring maximum demand in terms of KVA.

It is the object of my invention to provide a meter device which will measure in terms of KVA the maximum demand and the total amount of power used. My invention also provides means for measuring and indicating at the same time the total KW and the maximum demand in KW. The same means may be employed for measuring and indicating the average power-factor and the power factor over a given period such as a half hour during which the maximum demand is measured.

In order to acquaint those skilled in the art with the manner of constructing and practising my invention, a detailed description of a device embodying the invention will now be given in connection with the accompanying drawings.

Fig. $5^A$ and Fig. $5^B$ shown as two parts of a system consist of a diagrammatic layout of my invention as applied to a three phase line and providing means for recording the periodic demand in terms of KVA and in KW and for recording the power-factor for the given period.

Figure 1:
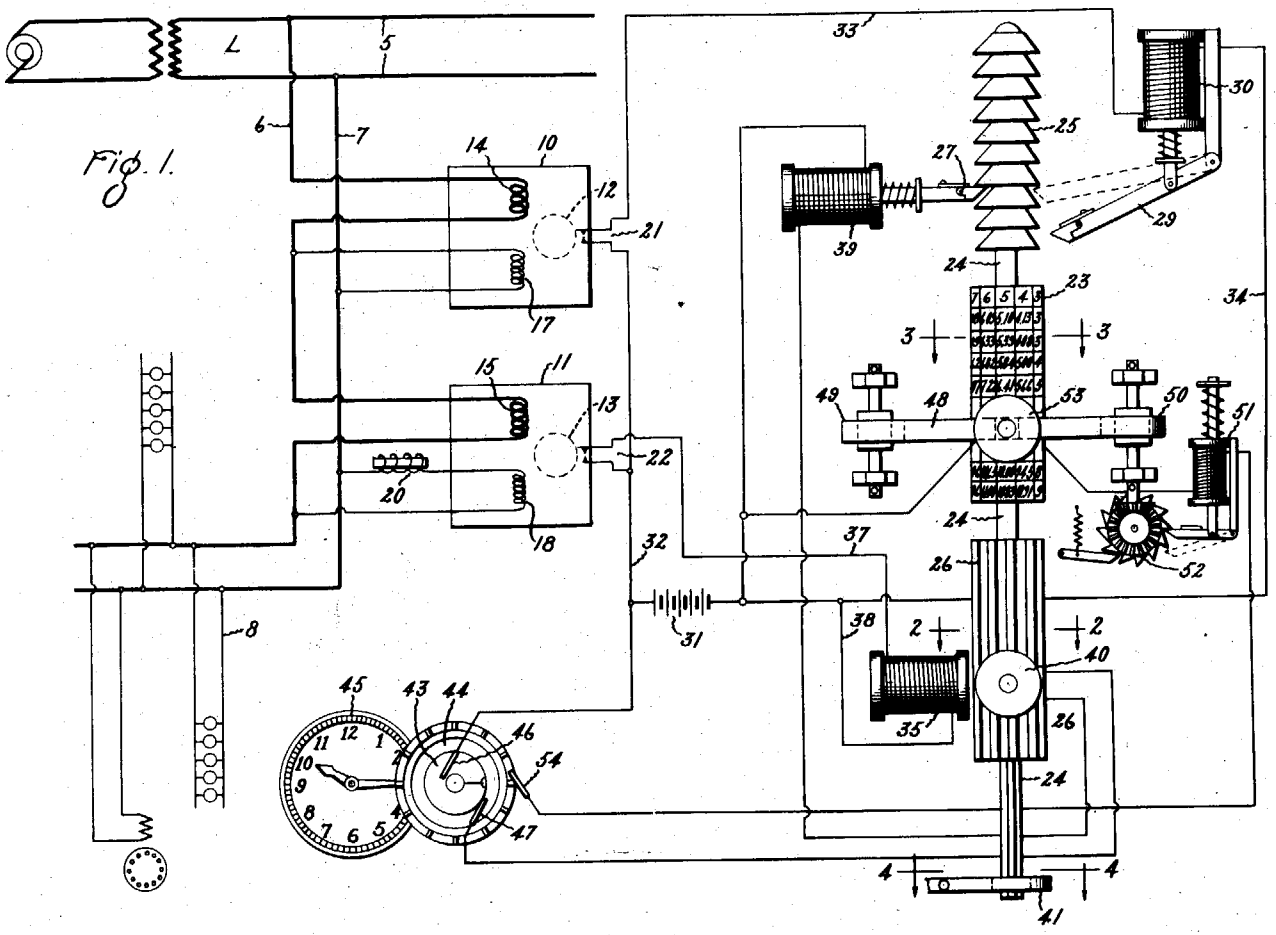
Figure 1 is a diagrammatic layout of a system embodying my invention for indicating maximum demand in terms of KVA for a given period.
Figure 6:
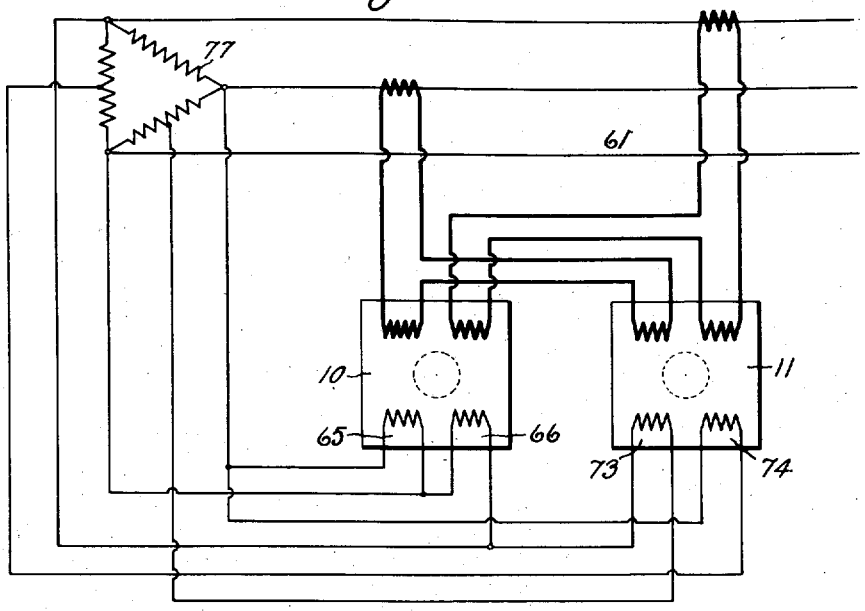
Figure 3:
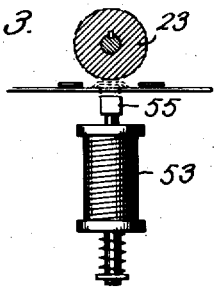
Fig. 3 is a similar view taken on the line 3—3 of Fig. 1.
Figure 2:
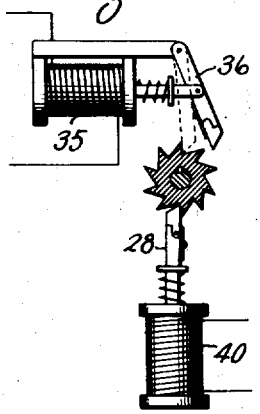
Fig. 2 is a diagrammatic sectional view taken on the line 2—2 of Fig. 1.
Figure 4:
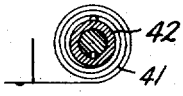
Fig. 4 is a similar view taken on the line 4—4 of Fig. 1.
Figure 5:
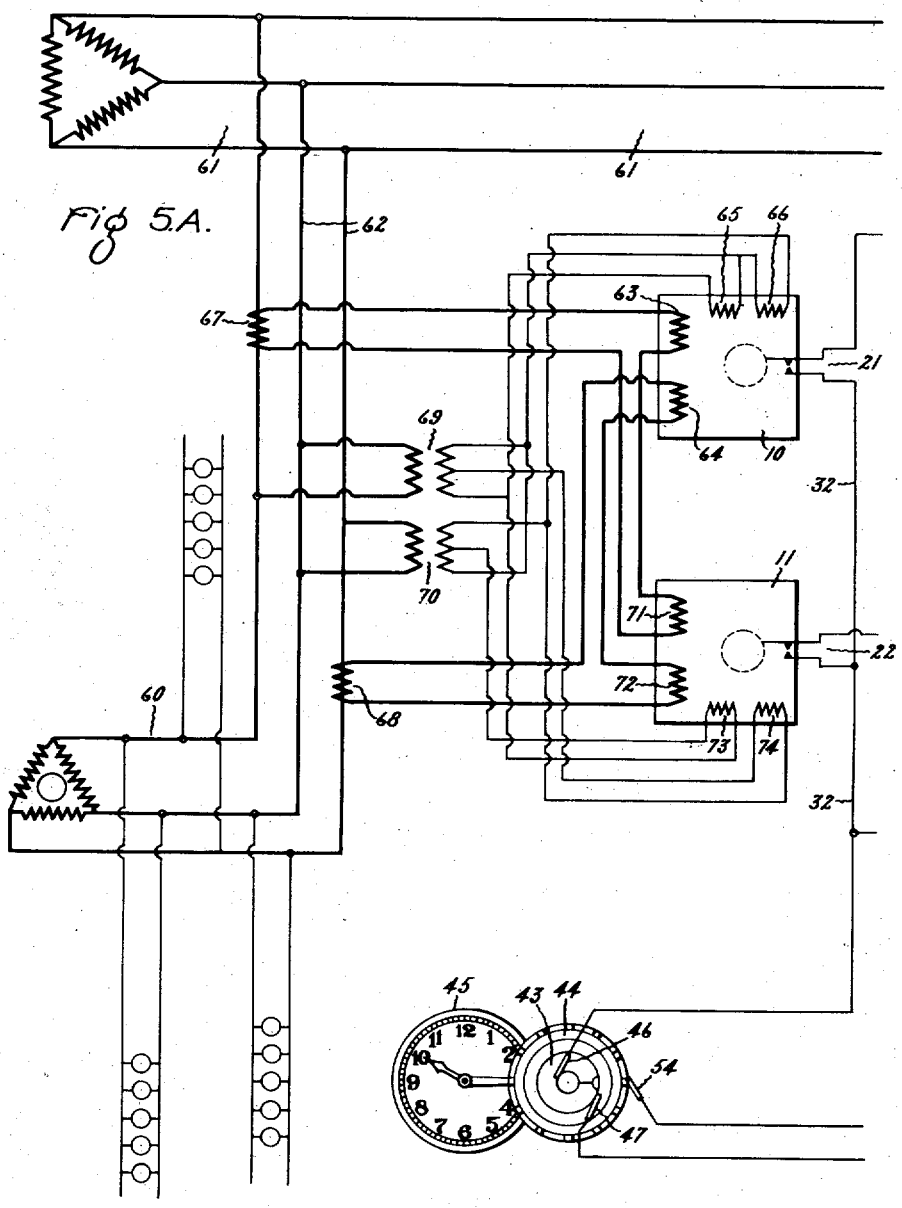
Figure 6:
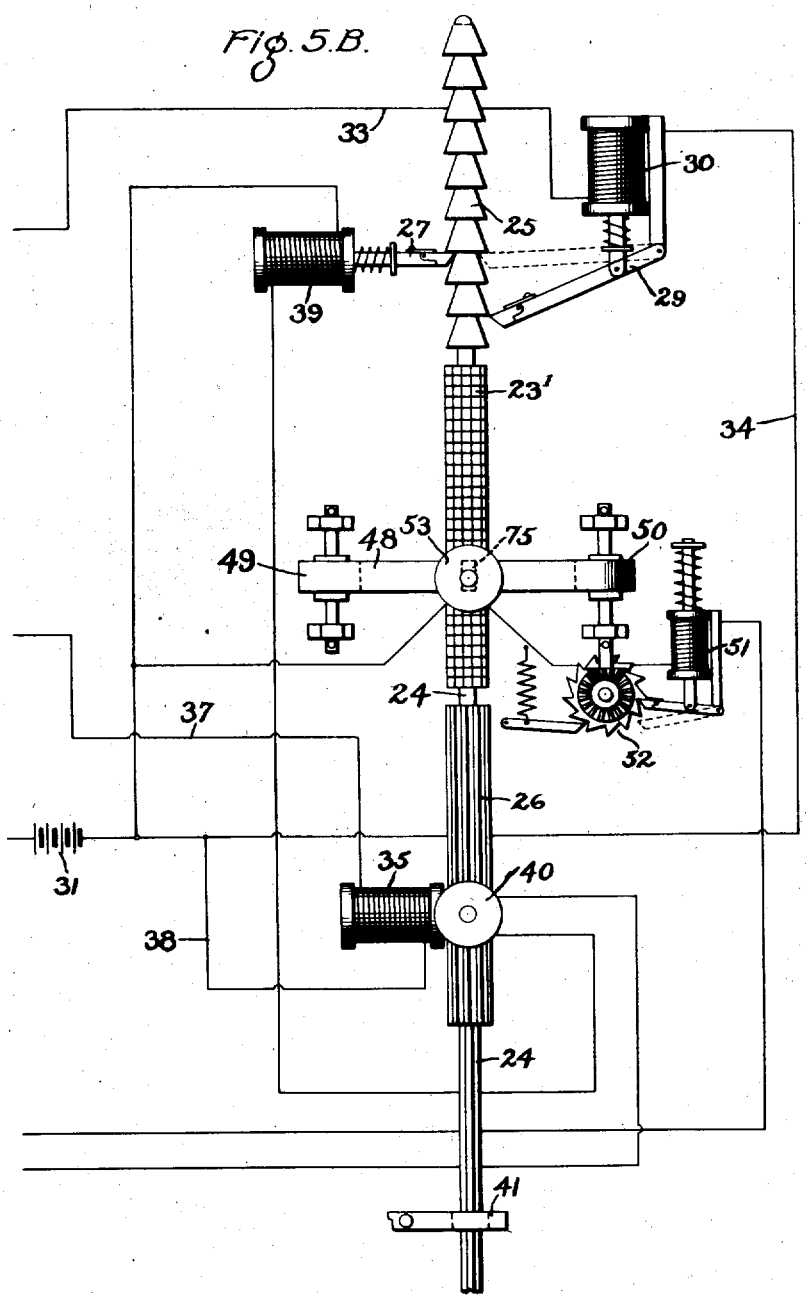
Figure 12:
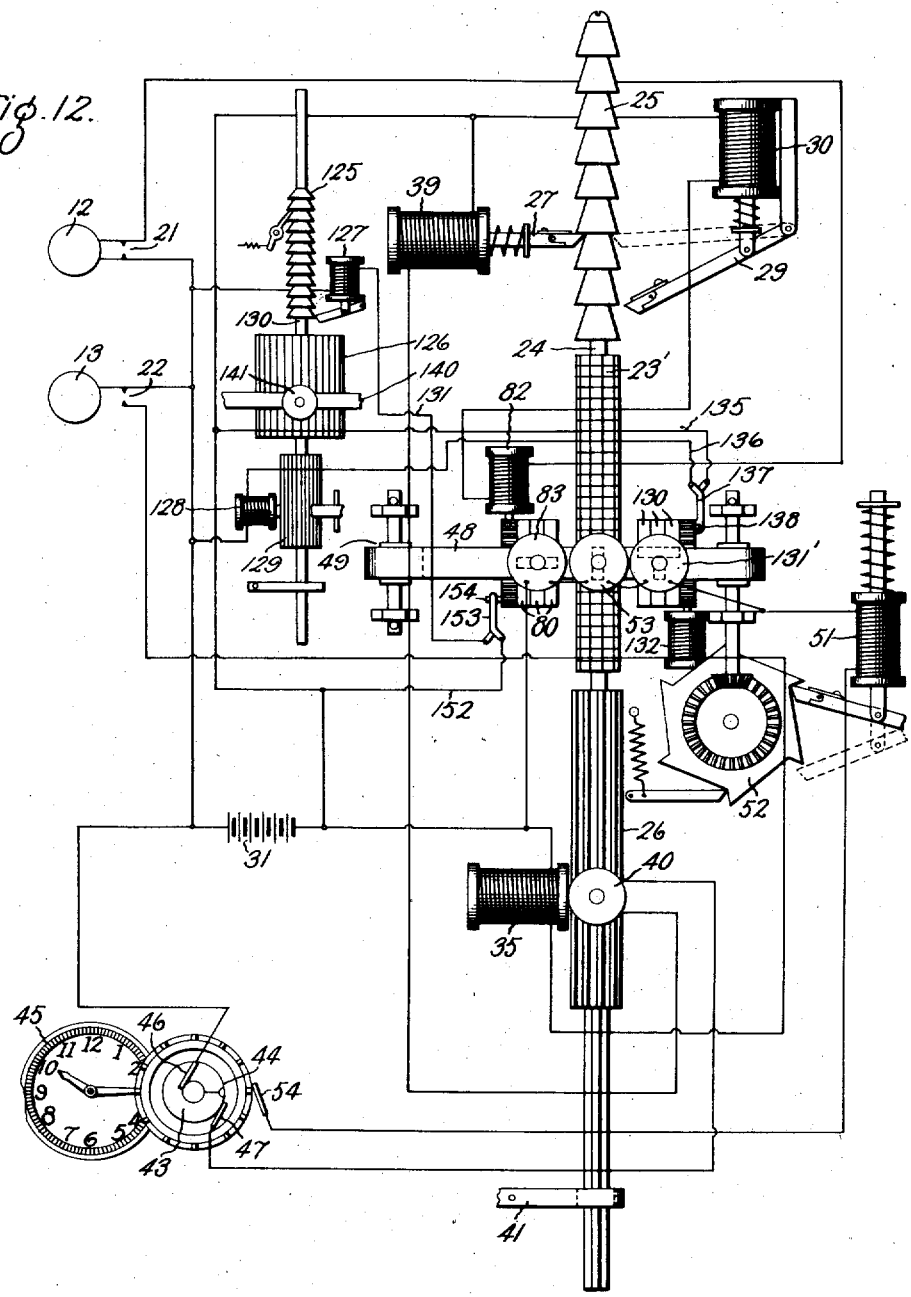

Fig. 6 indicates diagrammatically another form of connection for a three phase line;

Fig. 7 is a developed view of the printing cylinder shown in Fig. 1;

Fig. 8 is a developed view of the printing cylinder shown in Fig. $5^B$;

Fig. $8^A$ is a developed view of the cylinder as shown in Fig. 12;

Figs. 9, 10, and 11 are explanatory diagrams;

Fig. 12 is a diagram of a modification showing means for recording the periodic value of KVA power factor, KW, reactive component and the total of KVA, KW, and reactive components.

Fig. 13 is a fragmentary view of the record made where periodic KVA and total KVA are recorded;

Fig. 14 is a similar fragmentary view showing the record made when periodic KVA total KVA power factor and KW are recorded;

Fig. 15 is a chart or diagram explanatory of the theory of measuring KVA;

Fig. 16 is a fragmentary view of the record made where the two components are periodically recorded in terms of demand, together with the power factor and the periodic KVA, together with the accumulated values of the various periodic values; and Fig. 17 is a similar view showing the values differently placed on the strip.

The means which I provide is preferably of the same general character as described in my above mentioned copending application for measuring power factor. The invention may be practised in many different forms and is not necessarily limited to the details shown and described. I provide two wattmeter elements of the integrating type as the responsive element in the line, one of these wattmeters being responsive to power component of the current flowing, and the other being responsive to wattless component of the current flowing.

Preferably I provide a cylinder having means on its face for indicating KVA in accordance with the axial and rotary position of the cylinder. The cylinder is moved axially to represent the response of the one watt-meter element to the power component and to be moved rotarily to represent the response of the other wattmeter element to the reactive component. The cylinder may obviously be moved in opposite relation by the respective wattmeter elements. The surface of the cylinder is divided into minute fields preferably on rectangular coordinates to provide separate fields upon which may be inscribed or otherwise indicated the corresponding values of KVA or power factor or any other quantities as by suitable numerals or other indicating or recording means. The cylinder may be provided with indications for indicating or recording the value of other geometric or trigonometric functions of the variables to which the wattmeter elements are responsive.

A plane surface or any other surface may be provided instead of a cylindrcial surface and either the surface itself may be moved or two indicating members operating preferably in different directions to each other and having an intersection which constitute their reference point may be moved across the field to indicate such values. If desired the reference point may be moved in one direction and the chart in another. In any event the chart is graduated in two dimensions and relative motion of the chart and the reference point may be secured in any preferred manner.

Considering first, Figs. 9 to 11 and 15, I shall briefly explain the theoretical nature of the chart or surface and its relation to the quantities to be measured.

In alternating current the relation between the electromotive force and the flow of current broadly may be represented by the curves shown in Fig. 9. The curve 1 which represents the electromotive force is shown in this case as leading the curve 2, which represents current by the angle $\varphi$ which in this case is shown as approximately 30°. In harmonic motion the angle passed over represents the time elapsed.

The relation between electromotive force and current may be indicated in vectors or polar coordinates as is shown in Fig. 10. In this figure the line OE represents the direction and value of the electromotive force and the line OI represents total current flowing. It will be seen that the vector OI lags behind the vector OE by the angle $\varphi$. Taking the line OE as a base line and visualizing the expression for power, namely, power equals EI cos. $\varphi$, we may assume that the vector OI which represents current is made up of the two components OX and XI. The component OX represents the in-phase or power component while the vector OI represents the reactive or wattless component of current. The one wattmeter element will respond to the power component and the value of this component may be represented by the line 4. The other wattmeter element is responsive to the reactive component and the value of this component may be indicated by the line 3. Having predetermined the fact that these two components are at right angles to each other the other functions of the triangle may readily be evaluated from the well known laws of the right angle triangle.

Whereas in my prior application the particular consideration was the measurement of the angle of lag, the cosine of which is taken as the power factor and this angle being in fact independent of the length of the sides the present invention is concerned with the length of the third side and consequently the values of the two sides 3 and 4 in absolute terms must be determined and employed to find the absolute value of the third side.

While the actual measurement of power is concerned with the product of electromotive force, and current, it will be noticed that the two wattmeter elements do in fact take into account the product of the particular component of current and electromotive force and consequently the length of the sides 3 and 4 will always be proportional to the product of electromotive force and the particular component and as a result the length of the side 5 will always be proportional to the absolute value of KVA.

The means which I have provided evaluates the component 5 through the medium of a chart graduated in two dimensions. Consider the chart as shown in Fig. 11 and assume that the vector OI be laid out at the proper angle with the base line OE. While the value of the vector OI in terms of length may be the same for a great number of different values of the angle $\varphi$ each particular position may be analyzed into the component OX and XI. However, as the means which I provide is responsive to the components OX and XI and the desired result is the value of the vector OI in terms of length, it is possible to ascertain the value of the length OI by graduating the chart in rectangular coordinate and to secure the appropriate value of the vector at all times.

Thus consider Fig. 15, and assume that the end of the vector will rest within one of the small squares as for instance the point P. If the surface is divided into fine enough subdivisions, it will be seen at once that as accurate measurement may be secured as desired. Thus the point P is determined by the values in rectangular coordinate or the hypotenuse of a triangle having the sides of a length of three units and seven units respectively and the natural consequence is that the length of the hypotenuse must be 7.62 units. Therefore, the value 7.62 may be placed within the square designated.

The other functions of the triangle may be placed in the square if such information is desired. Thus, for instance, besides the value in kilovolt amperes there may be placed the value of watts, the value of the reactive component, and the cosine of the angle or power factor if desired.

Thus, the chart shown in Fig. 7 is graduated in terms of the hypotenuse of the triangle determined by the two sides, the value of which is reactive component and power component respectively. The chart may be otherwise graduated as above indicated. In Fig. 8 I have shown a chart for indicating the periodical values of KVA, of power factor and of KW.

In Fig. 8A the chart is shown as graduated in terms of KVA, power factor, KW and reactive component.

In Fig. 1 I have indicated diagrammatically a single phase transmission line L, connected by the wires 6—7 with the customer's load 8, which may consist of any desired power consuming apparatus.

The two wattmeter elements 10 and 11 are suitably connected to wires 6 and 7 to give indications of the power component and to the reactive component respectively. The wattmeter elements 10 and 11 are the integrating type having the rotating elements 12 and 13 shown in dotted line. The coils 14 and 15 are connected in series with the load 8, and the pressure coils 17 and 18 are suitably connected across the mains 6 and 7, the wattmeter element 11 being provided with means which will provide a component operating at substantially 90 degrees to the electromotive force in the coil 17 of the meter 10. This means is indicated as the inductance 20 although any suitable construction of wattmeter element may be employed.

The particular manner of constructing the wattmeter forms no part of the present invention, and a detailed description of the same is, therefore not essential.

The rotatable elements 12 and 13 govern the normally open contacts 21 and 22, these contacts being closed at the completion of a revolution of the corresponding rotatable members, or any suitable part of a revolution thereof as may be desired.

I provide a common element controlled by the two wattmeter elements, in this case the cylinder 23, having motion in two directions, namely, in an axial or longitudinal direction and in a rotary direction respectively. These two motions are controlled by the wattmeter elements 10 and 11 respectively. The axial component represents the component lying along the line OX in Fig. 10, namely the power component, and the rotational motion is represented by the component lying on the line XI in the same figure, namely the wattless or reactive component.

The cylinder 23 is mounted upon a shaft 24 and is provided with the lifting ratchet 25 and the rotating ratchet 26, by means of which this cylinder may be moved axially and rotatively respectively. The lifting ratchet 25 is provided with a holding pawl 27 and the rotary ratchet 26 is provided with a similar holding pawl 28. An actuating pawl member 29, operated by the solenoid 30 is controlled by the wattmeter element 10 to raise the cylinder 23 in step by step motion. The circuit for the solenoid 30 is formed as follows:

From the battery or source of current 31 through the wire 32 to the contact 21, wire 33 through the winding of the solenoid 30 and then back to battery over the wire 34. Thus for each closing of the contact 21 at the power wattmeter 10 the cylinder 23 will be advanced axially by one step. An operating solenoid 35 for rotating the drum is controlled by the contact 22 over the following circuit: from battery 31 over the wire 32 through the contact 22, wire 37, through the winding of the solenoid 35 and back to battery 31 over the wire 38. It is thus apparent that the printing cylinder 23 is advanced one step rotarily for each closing of the contact 22 by the reactive wattmeter 11.

The holding pawls 27 and 28 respectively are controlled by the solenoids 39 and 40 respectively and these holding pawls are withdrawn periodically to reset the printing cylinder 23 for the beginning of the next period. In this connection it is to be noted that I provide a spring 41 of the spiral type at the lower end of the shaft 24 through the medium of a sleeve 42 which is keyed to the shaft 24, but which permits axial movement of the shaft with respect to said sleeve. Thus, when the solenoids 39 and 40 are energized to withdraw the holding pawls 27 and 28 respectively the spring 41 moves the drum 23 back to its zero position with respect to motion of rotation and the weight of the drum and connected parts lowers the drum axially to its zero position with respect to the axial motion.

The solenoids 39 and 40 which control the resetting are in turn controlled by a suitable time controlled contact shown in this case as mounted on the disk 43. The disk 43 as well as the disk 44 is suitably driven at a predetermined rate by time controlled mechanism in this case illustrated by the clock 45. Thus whenever the contact between the brushes 46 and 47 is closed the printing cylinder 23 is reset.

I have provided means for periodically recording the position of the cylinder, and thereby recording the periodic value of the KVA. This record is made by means of the record strip of paper 48 which strip is fed from the supply roll 49 to the takeup roll 50. The feeding of this strip is controlled by a solenoid 51 and suitable pawl and ratchet mechanism 52 to advance the strips immediately after the printing magnet 53 has been energized. The printing magnet 53 and the paper feeding magnet 51 are connected in series and are controlled by the contact brush 54 and the rotary contact making disk 44 so that periodically the printing magnet 53 is energized to make a record of the reading of the cylinder 23, and the paper feeding magnet 51 is energized to advance the paper after the printing operation. The feeding ratchet mechanism 52 is illustrated in the deenergized position of magnet 51. I have shown the contact disk 44 as provided with numerous contacts for making frequent records of the readings of the cylinder 23, but it is to be understood that only one printing operation may be performed for each period, and that preferably at the end of the period just before the cylinder 23 is reset.

The printing magnet 53 is provided with a printing platen 55 which is of substantially the same size as the squares or rectangles provided on the cylinder 23 so that only the figure directly under the platen 55 will be printed upon the record strip 48. The platen 55 thus performs the function of a reference point for the cylinder 23. The above is an exemplification only and is not the only manner in which the cylinder may be graduated.

I have shown ten steps in each direction, but it is to be understood that the number of steps may be varied and preferably should be considerably increased. Where it is desired merely to indicate and not to record, a stationary reference point may be employed and the square or indication which is brought into register with the reference point then determines the reading of the instrument.

Instead of employing two release magnets 39 and 40 a single magnet may serve to release both of the holding pawls 27 and 28. While a cylindrical drum is preferable for reducing the size of the apparatus, it is to be understood that a moving surface of any other character might be employed so long as this surface has a motion in two directions with respect to the reference point and is suitably graduated or inscribed to give the proper values of KVA.

In Figs. $5^A$ and $5^B$ I have shown the manner of connecting the device of my invention to a three phase load circuit. In this case the three phase load 60 is connected to the mains 61 through the leads 62. The power wattmeter element 10 is provided with two current windings 63 and 64 respectively, and the two potential windings 65 and 66 respectively. These windings are connected in any well known manner to the leads 62 as by means of two current transformers 67 and 68 disposed in series relation to the two phases of load 60 and the potential transformers 69 and 70 respectively connected across to the phases of the load. The meter 11 which is responsive to reactive component is provided with two current coils 71 and 72 and with two pressure coils 73 and 74 respectively. The current coils 71 and 72 are connected in series with the secondaries of the current transformers 67 and 68. The pressure coils are connected so as to receive only a component at right angles to the flow of current.

The cylinder 23′ shown in Fig. $5^B$ is provided with indicating characters such as type for indicating and printing not only the demand in KVA for the period, but also the power factor and the KW for the same period. The surface of the cylinder 23′ is shown as developed in Fig. 8. It is apparent that a greater number of steps may be advantageously employed, although the number of steps is not of the essence of the invention. The platen 75 which strikes the recording strip 48 against the type of the cylinder 23′ is made of the proper size to embrace the three small corresponding faces or areas. Thus, are recorded side by side on the recording strip 48 the KVA demand for the particular period, the demand for the same period in KW and the power factor over that period. In other respects not above mentioned the system shown in Figs. $5^A$ and $5^B$ is the same as that shown in Fig. 1.

As explained in my copending application the chart which forms the face of the drum may be constructed so that if the number of steps made by the actuating magnet is greater than the number of steps which the drum will permit, the drum will give indication of this fact so that error in the particular reading may be guarded against so that a larger drum may be provided for the particular installation where the same is necessary.

In Fig. 6, I have illustrated the manner in which the pressure coils of the wattmeter elements, may be connected to the mains to secure the desired readings. The pressure coils of the power wattmeter element 10 are connected across two phases of the line, but the pressure coils of the reactive wattmeter 11 are connected to the coils of the power transformer 77.

The particular manner of making the connections is not of the essence of the invention as it may be varied. Instead of connecting to the windings of the service transformers as indicated at 77, in Fig. 6, an artificial load may be provided through which connections may be made.

In Fig. 12, I have indicated diagrammatically a modification of a form of device shown in Figs. $5^A$ and $5^B$, in which totalizing counters for totalizing power component, reactive component, and KVA are provided.

The numeral wheels 80 and 130 have inscribed thereupon characters suitable for printing, these characters reading in terms of total power component or actual KW and in total reactive component respectively. The numeral wheels 80 are operated by the electromagnet 82 which is connected in series with the vertical stepping magnet 30, so that for every operation of the vertical stepping magnet 30 another unit is added to the indication on the totalizer wheel 80, thereby registering continuously the increase in actual power consumed. In the same way the totalizer magnet 132 is arranged in series with the rotary stepping magnet 40 and serves to accumulate or totalize the amount of reactive component over any given time. I have provided further a KVA totalizing drum, 126, which in principle is of the same character as the drums 23,—23′ and the like, adapted to be operated axially and rotarily by the stepping magnets 127 and 128 respectively. The stepping magnet 127 has a suitable pawl arrangement for engaging the axial ratchet 125 and the rotary stepping magnet 128 also has a suitable pawl for engaging the rotary ratchet 129. The drum 126 and the ratchets 125 and 129 are suitably connected by a shaft 130, the result being that the drum 126 is capable of the same motions as the drum 23 or 23′. The axial stepping magnet 127 is connected by a suitable circuit 131—152 to the battery 31 through the medium of the contacts 153. These contacts 153 are subject to the action of the pin 154 which is operated in unison with one of the register wheels 80. Thus for a cycle of operations representing a certain amount of power component or KW the stepping magnet 127 will be operated a single unit.

The rotary stepping magnet 128 is controlled over a similar circuit 135,—136 and contacts 137. The contacts 137 are adapted to be closed by the pin 138, which pin is connected to one of the numeral wheels 130, and closes the circuit 135—136 for a cycle of operations representing a predetermined unit of the reactive component. The vector addition of the two components in thus effected by means of the cylinder 126 which is a totalizer for KVA. This cylinder may be arranged to print its indication upon the record strip 48 if so desired, or a separate record strip 140, and a suitable printing magnet or other mechanism 141, may be provided.

The printing magnets 83 and 131′ and the printing magnet 141 if desired, may be connected in series with the printing magnet 53 so that a simultaneous operation of printing may be caused. This printing operation takes place just before the paper advancing mechanism is operated, consequently each indication will periodically be printed upon a fresh surface. It is to be assumed that suitable connections for the integrating wattmeter elements 12 and 13 are provided. For instance, as shown in Figs. 1, $5^A$, and 6 or any other suitable or preferred connection may be employed.

The operation of a system will be apparent from the above description. Suffice it to say that for each closure of the contact 21 by the power controlled meter element 12 the vertical stepping magnet 30 will raise the drum 23′ by one complete step and similarly closing of the contact 22 by the wattmeter element 13 will cause energization of the rotary stepping magnet 35 to rotate the drums through a predetermined step. At the same time the register wheels 80 and 130 are advanced in unison with the vertical and rotary stepping operation. When a predetermined number of steps has been made by the register stepping magnet 82 and 132, the corresponding stepping magnets 127 and 128 will be operated to trigonometrically combine the component upon the drum 126.

The possibilities of this system are very great. It is possible to record individually or collectively all of the factors which enter into the calculation of electrical power. Thus it is possible to indicate and record KW power factor, KVA, reactive component and the totals of the same. The periodic indication and recording of these quantities is valuable in consideration of the maximum demand. The power factor is also valuable in considering the power factor at which this demand is made and the two quantities may be combined in an indication of the maximum demand in KVA.

At the same time the demands in KVA are integrated into a total over any given period or as a continuous accumulation.

The record strips which may be made are shown in Figs. 13, 14, 16 and 17 in detail. It is apparent that any one or more of the quantities which are shown on this record strip may be omitted if desired and a record of the others only made. At the end of a given period as controlled by the time controlled mechanism and contact mechanism governed thereby, the circuit for the paper advancing magnet 51 and for the printing magnets 53 and 83 will be energized so that a record is made of the reactive component during a given period, the power component during that period, the average power factor during that period and the KVA during the period. At the same time the record of total power component and total KVA may be made if desired.

Fig. 13, shows merely the maximum demand in KVA and the accumulated KVA, such as would be recorded in a maximum demand meter and an accumulating meter reading in terms of KVA.

Fig. 14 records the same quantities, together with KW during the period and the accumulated KW together with the power factor during that period.

It will be noticed that the demand may be stated in fractions, but the total may be stated in terms which are not quite the equal of the previous total, plus the periodic demand. This is due to the fact that the total is increased only when the pins 154 and 158 make complete revolutions. The result is that the periodic value is accurate to a higher degree than the accumulated figure, although the degree of error is in terms of percentage not substantially different. The record strip may be given a suitable marking as shown at 160 in Figs. 16 and 17 to indicate the end of a period. Other suitable indications may be made upon the record if desired.

The values of KVA which appear within the square of the charts Figs. 7 and 8 and 8A may be mathematically determined as indicated in Fig. 15. Consider the point P which lies at the center of one of the squares as typical of all points within the square.

This assumption may be made as nearly correct as may be desired by decreasing the size of the squares. The point P lies a horizontal distance of three steps away from the Y axis and lies a vertical distance of 7 steps or units in a vertical distance from the X axis. The right angle triangle OX′ P which may then be constructed with the hypotenuse OP of a length which may be readily determined by the well known Pythagorean proposition. As the side OX′ is three units long and the side X′ P is seven units long the length of the hypotenuse may be taken as 7.62. The power factor may at the same time be determined as a cosine of the angle POX′.

The values of KVA and of power factor may be determined in any other way as for instance graphically if desired.

I have illustrated heretofore only rectangular coordinates, but it is to be understood that polar coordinates or a combination of both may be used.

It is to be understood that where an unbalanced three phase system is connected the KVA indication is a summation of the three phases. The power factor indication will be an average indication of the three phases.

I do not intend to limit the invention to any particular form of apparatus other than as the same is specified in the following claims. For the purpose of my invention, it is immaterial whether the surface itself may be moved or whether the reference point be moved with respect to the surface. Such embodiment of the invention is obviously intended to come within the scope of the appended claims. It is also apparent that a partial movement of the surface and a partial movement of the reference point may accomplish the same end, namely, that of bringing the proper indication or recording character into line with the reference point, so that an exact reading and recording may be made. I am aware that my invention includes a number of individually novel features in devices of this character, and I am, therefore, making claim to the same.

In laying out the chart, the indication which is applied to the unit field or facet is preferably taken as the value of the central point. This corresponds to the average value of all points within the field. Any other preferred method or scheme of fixing the values of the indications may be employed.

The unit areas need not be square. For instance they may be oblong. In such case the units in one dimension are greater than in the other dimension.

I have employed the term KVA as designating the unit of power which is to be measured. It will be understood that volt-amperes or VA is strictly speaking the fundamental unit, but the multiple unit KVA is used commercially because it is more convenient.

I claim:

1. In combination, a line adapted to have current flowing therein, characterized by two variables, integrating means responsive to one of said variables, separate integrating means responsive to the other variable and a common movable device jointly controlled by said means for measuring and indicating a vector sum of said variables and means for periodically resetting said device.

2. In combination, an integrating wattmeter for power component, an integrating wattmeter for reactive component, and means controlled jointly by said wattmeters for combining the power component and the reactive component measured by said wattmeters over a given period in terms of KVA said means comprising a device for laying out said components at right angles to each other from a given point.

3. Means for simultaneously obtaining the demand of power component, reactive component and apparent power of an alternating current circuit comprising in combination an integrating wattmeter for reactive component, an integrating wattmeter for power component and means controlled jointly by said wattmeters for combining the power component and the reactive component measured by said wattmeters over a given period and indicating the result in terms of reactive component, power component and KVA.

4. In combination, an integrating wattmeter for power component, an integrating wattmeter for reactive component and means controlled jointly by said wattmeters for combining the power component and the reactive component measured by said wattmeters over a given period in terms of KVA, said means consisting of a device for obtaining the comparative value of the hypotenuse of a right angle triangle to the other side thereof, which sides correspond to the power and reactive components respectively.

5. In combination a line adapted to have current flowing therein, said current being characterized by two variables, namely, in-phase component and wattless component, integrating means responsive to the in-phase component, integrating means responsive to the wattless component, and a chart having inscribed thereon the vector sum of the two variables, said chart being graduated in two dimensions and a third means cooperating with the chart under the control of said first and said second means to select the corresponding value of the vector sum of said two variables.

6. In combination, a line adapted to have current flowing therein, said current being characterized by two variables, namely, in-phase component and wattless component, means responsive to the in-phase component, means responsive to the wattless component, and a chart having inscribed thereon a vector sum of the two variables, said chart being graduated in two dimensions, a third means cooperating with the chart under the control of said first and said second means to select the corresponding value of the vector sum of said two variables, and means for periodically resetting said chart.

7. The method of indicating maximum demand in terms of KVA over a given period, which comprises integrating the instantaneous values of the reactive component over said period into predetermined units, integrating the instantaneous values of the power component over said period into corresponding predetermined units, laying out said units as they are completed upon a surface graduated in terms of the hypotenuse of the right angle triangle formed by the two sides of a length corresponding to the units of reactive component and power component, respectively, and indicating by the graduation nearest the point so determined at the end of the period the value of KVA which is the vector summation of the integrated values of reactive component and of power component.

8. In combination a pair of meter elements responsive to different characteristics of an electric current, a common indicating element comprising a chart graduated in two dimensions, and a reference member, said indicating element being movable with respect to the reference member in two dimensions, said indicating element being subject to both meter elements, and adapted to indicate the vector resultant of the two characteristics over a given period of time.

9. The method of measuring and recording maximum demand in terms of KVA of an electric flow of power in a line with a surface graduated in two dimensions from a zero point in terms of KVA, and a reference member, which comprises, summing up or integrating the instantaneous values of reactive component into units of predetermined value, and when a unit is completed moving the surface and the member, relatively to each other in response thereto a unitary amount in a given direction with reference to the zero position, simultaneously summing up or integrating the instantaneous values of the power component into corresponding units of predetermined value, and when a unit of the latter class is completed, moving the surface and the member relatively to each other in response thereto a unitary amount in a direction at substantially right angles to the first given direction with reference to the zero point, whereby said reference member and said chart at any time designate the desired vector summation of the units, and at the end of a given period of time recording the position of the chart, relative to the reference member in terms of KVA.

10. In combination, a pair of integrating meter elements sensitive to different characteristics of an electric current, a common indicating element comprising a chart graduated in two dimensions in terms of KVA, and a reference point, said indicating element being movable with respect to the reference point in two dimensions, said indicating element being subject to both meters and adapted to indicate the vector sum or resultant of the two characteristics in terms of KVA over a given period, and means for recording said indication.

11. In combination, an integrating meter responsive to a function of the power component flowing in a conductor, a second integrating meter responsive to a function of the reactive component flowing in a conductor, a chart graduated in two dimensions in terms of the vector summation of the two components, and reference means for selecting an indication on the chart, said reference means and said chart being relatively movable with respect to each other.

12. In combination, a line adapted to have current flowing therein, said current being characterized by two variables, integrating means responsive to one of said variables, integrating means responsive to the other of said variables, a chart member graduated in two dimensions into unit areas covering the surface thereof, a cooperating indicating member, each unit area of said chart bearing thereupon, the vector sum of the two dimensions which define the position of said area, one of said members being individually controlled by each of said means to bring the proper unit area in register with the indicating member to indicate the vector sum of the two variables over a given period.

13. In combination, a line adapted to have current flowing therein, said current being characterized by two variables, integrating means responsive to one of said variables, integrating means responsive to the other of said variables, an indicating chart member comprising a series of contiguous facets extending in two dimensions, each facet having thereupon a numeral or indication of the average distance from the zero point of all the points in said facet, and a cooperating indicating member, one of said indicating members being individually controlled by each of said means to bring the proper unit area in register to indicate the vector sum of the two variables.

14. In combination, a line adapted to have current flowing therein, said current being characterized by two variables, integrating means responsive to one of said variables, integrating means responsive to the other of said variables, a chart member comprising a series of contiguous rectangles said surface having a zero point and each rectangle having an indication thereon of the approximate distance of said rectangle to the zero point, a cooperating indicating member, one of said members being individually controlled by each of said means to bring the proper unit area in register with the indicating member to indicate the vector sum of the two variables, and means for periodically recording said indication.

15. In combination, integrating means adapted to be responsive to the reactive component of power flowing in a line, integrating means adapted to be responsive to the power component flowing in said line, a third means comprising an indicating surface graduated in two dimensions in accordance with the KVA which is the vector sum of the two components flowing in the line, and means cooperating with said graduated surface and adapted to be brought into register with the proper valuation on said surface to indicate KVA, one of said latter two means being controlled jointly by the first two means to bring said surface and said last means into register.

16. In combination, an indicating element comprising a drum having its cylindrical surface graduated in two dimensions, means responsive to power component for moving the drum in one dimension, and means responsive to reactive component for moving the drum in the other dimension, and indicating means adapted to cooperate with the drum and to be brought into register with the particular portion of the surface of the drum which indicates the vector summation of the two components.

17. The method of indicating and recording maximum demand in terms of KVA over a given period which comprises integrating the instantaneous values of the reactive component flowing in the line during said period into predetermined units, integrating the instantaneous values of the power component during said period into corresponding predetermined units, laying out said units as they are completed upon a surface graduated in functions of the two components and indicating the vector sum of the two components and making a record of the indicated sum so determined.

18. In combination, an element having a surface with indications thereon corresponding to various values of KVA, integrating means responsive to the power component of electrical energy flowing in a line and integrating means responsive to the reactive component flowing in said line, both of said means cooperating with the element to cause an indication to be given of the vector sum and of the two components of electrical power flowing in said line.

19. In combination, means adapted to be responsive to reactive component of power flowing in a line, means responsive to the power component flowing in said line, a third means comprising an indicating surface, graduated in accordance with the vector sum of the two components in terms of KVA, said means being influenced by said first two means to give an indication of the power flowing in the line in terms of KVA vector, which is the vector sum of said two components, and means for periodically recording said indication.

20. In combination, means adapted to be responsive to reactive component of power flowing in a line, means responsive to the power component flowing in said line, a third means comprising an indicating surface influenced by said first two means to give an indication of the vector sum of the two components, and means for periodically recording the reading of said indicating surface.

21. In combination, a line an element having an indicating surface, said surface being subdivided into unit areas said areas bearing indications corresponding to the average distance of points in each unit area from the zero position of the surface, a first electrical means responsive to the reactive component in said line, a second electrical means responsive to the power component in said lines, means for selecting a particular indication on said surface, said surface being adapted to be brought into register with said latter means by joint action of the first and of the second electrical means to select thereby the value of the distance of a particular surface from the zero position in terms of KVA, and means for periodically returning said surface to the zero position.

22. In combination, a line an element having a surface provided with indications corresponding to values of KVA, means subject to the reactive component in said line for moving said surface in one direction only, means subject to the power component in said line for moving said surface in another direction only to bring a corresponding indication on said surface into register with a predetermined reference position.

23. In combination, a line an element having a surface provided with indications corresponding to values of KVA, means subject to the reactive component in said line for moving said surface in one direction only, means subject to the power component in said line for moving said surface in another direction only to bring a corresponding indication on said surface into register with a predetermined reference position, and means for periodically recording the indication which is brought into register with the reference position.

24. In combination, a line an element having a surface provided with indications corresponding to values of KVA, means subject to the reactive component in said line for moving said surface in one direction only, means subject to the power component in said line for moving said surface in another direction only to bring a corresponding indication on said surface into register with a predetermined reference position, and means for periodically recording the indication which is brought into register with the reference position, and means for resetting the surface immediately after the record has been made.

25. In combination, a line a first wattmeter element responsive to reactive component in said line, a second wattmeter element responsive to power component in said line, a common indicating element comprising a surface subdivided into unit areas bearing thereupon predetermined values of KVA; means responsive solely to the first wattmeter element and means responsive solely to said second wattmeter element, both of said latter means operating said common indicating element independently of each other to give a direct indication of the vector sum of the two components.

26. In combination, a line a first wattmeter element responsive to reactive component in said line, a second wattmeter element responsive to power component in said line, a common indicating element, means responsive solely to the first wattmeter element and means responsive solely to said second wattmeter element, both of said latter means operating said common indicating element independently of each other to give an indication of the vector sum of the two components, and means for periodically recording the indication of said indicating element.

27. In combination, a line a first wattmeter element responsive to reactive component in said line, a second wattmeter element responsive to power component in said line, a common indicating element, means responsive to the first wattmeter element and means responsive to said second wattmeter element, both of said latter means, cooperating with said common indicating element to give an indication of power factor and of KVA over a given period, said common indicating element being graduated in terms of power factor and KVA.

28. In combination, a line adapted to have current flowing therein, said current being characterized by two variable components, movable means responsive to said two variable components, said means comprising an indicating surface graduated in unit areas in two dimensions in terms of power factor and KVA.

29. In combination, a line adapted to have current flowing therein, said current being characterized by two variable components, means responsive to said two variable components, said means comprising an indicating surface graduated in two dimensions in terms of power factor and KVA, and means for periodically setting said responsive means back to zero position.

30. In combination, a line adapted to have current flowing therein, said current being characterized by two variable components, two integrating means, each of said means being responsive to one of said variable components only, a common movable means under the control of said two integrating means, said common means being adapted to be advanced in accordance with the integrations of said integrating means, said common means comprising an indicating surface graduated in two dimensions in terms of the vector sum of the two variable components.

31. In combination, a line adapted to have current flowing therein, said current being characterized by two variable components, two integrating means, each of said means being responsive to one of said variable components only, a common means under the control of said two integrating means, said common means being adapted to be advanced in accordance with the integrations of said integrating means, said common means comprising an indicating surface graduated in two dimensions in terms of the vector sum of the two variable components, said surface being also graduated in terms of power factor.

32. In combination, a line, a first integrating wattmeter element responsive to reactive component flowing in said line over a given period, a second integrating wattmeter element responsive to power component in said line over the same period, a common indicating element, means responsive to the first wattmeter element, and means responsive to said second wattmeter element, both of said latter means cooperating with said common indicating element to give an indication of the vector summation of the two components over said given period, said indicating element being graduated over its entire surface in terms of the trigonometric combinations of various values of components with each other.

33. In combination, a line, a wattmeter element responsive to reactive component in said line, a second wattmeter element responsive to power component in said line, a common indicating element, said indicating element being graduated in terms of power factor, and of power component, means responsive to the first wattmeter element, means responsive to the second wattmeter element, both of said latter means cooperating with said common indicating element to give an indication of power factor and of KVA, and means for simultaneously recording said indications.

34. In a device of the class described for combining two components lying at right angles to each other the combination of a surface which is subdivided into small areas each area being inscribed with the average distance of that area from the zero position, reference means cooperating with the surface, and integrating means responsive to said components for moving the area and the reference means with respect to each other to bring the surface and the reference means into register to indicate the value of the vector sum of the two components over a given period.

35. In combination, an integrating wattmeter for power component, an integrating wattmeter for reactive component, electric contacts respectively controlled by said wattmeters, electromagnets respectively controlled by said contacts, and means jointly controlled by said electromagnets for combining the power component and the reactive component measured on said wattmeters over a given period in terms of KVA.

36. In combination, a chart having numerous small areas laid out on rectangular coordinates, each of said areas having inscribed thereupon the average distance of all points lying within the area from the zero position, a reference member adapted to be brought into register with any particular area, means responsive to one variable for moving the reference point and the chart with respect to each other in one dimension, means responsive to another variable for moving the chart and the reference means with respect to each other in another dimension, and means for periodically recording the registered inscription and resetting said register to zero.

37. In combination, a line, an indicating element graduated in terms of KVA, reference means adapted to cooperate with the indicating element to select the proper indication on said element, integrating wattmeter means connected to the line and controlling said indicating element to bring the indicating element and the reference means into register for indicating the amount of power in terms of KVA which has passed through the line over a given period.

38. In combination, a line, an indicating element graduated in terms of KVA, reference means adapted to cooperate with the indicating element to select the proper indication on said element, integrating wattmeter means connected to the line and controlling said indicating element to bring the indicating element and the reference means into register for indicating the amount of power in terms of KVA which has passed through the line over a given period, and means for resetting the indicating element with respect to the reference means at the end of the period.

39. In combination, a line, an indicating element graduated in terms of KVA, reference means adapted to cooperate with the indicating element to select the proper indication on said element, integrating wattmeter means connected to the line and controlling said indicating element to bring the indicating element and the reference means into register for indicating the amount of power in terms of KVA which has passed through the line over a given period, and means for periodically making a record of the indication of said indicating means.

40. In combination, a line, means controlled by the power component of power flowing to the line, means controlled by the reactive component of power flowing to said line, a surface having graduations in one direction corresponding to the power component and having graduations in another direction corresponding to reactive component, and having figures lying substantially at the intersections of said graduations, said figures corresponding to the length of the hypotenuse formed by the two components of corresponding values, a relatively stationary reference member, means controlled by said first means to move the surface and the reference member with respect to each other in the first direction and means controlled by said second mentioned means to move the surface and the reference member with respect to each other in said second direction.

41. In combination, a line, means controlled by the power component of power flowing to the line, means controlled by the reactive component of power flowing to said line, a surface having graduations in one direction corresponding to the power component and having graduations in another direction corresponding to the reactive component, and having figures lying substantially at the intersections of said graduations, said figures corresponding to the length of the hypotenuse formed by the two components of corresponding values, a relatively stationary reference member, means controlled by said first means to move the surface and the reference member with respect to each other in the first direction and means controlled by said second mentioned means to move the surface and the reference member with respect to each other in said second direction, and means for periodically making a record of the figure brought into register with the reference member.

42. In combination, an integrating wattmeter for power component, an integrating wattmeter for reactive component, means controlled jointly by said wattmeters for combining the power component and reactive component measured by said wattmeters over a given period in terms of KVA, and means for periodically returning said first mentioned means to a zero position.

43. In combination, an integrating wattmeter for power component, an integrating wattmeter for reactive component, temporary register means for registering the power component, temporary register means for registering the reactive component, and means governed by said temporary register means for combining the two components as measured by said wattmeters in terms of KVA.

44. In combination an integrating wattmeter for power component, an integrating wattmeter for reactive component, and temporary register means for registering the vector sum of the components measured by said wattmeters over a given period.

45. In combination, an integrating wattmeter for power component, an integrating wattmeter for reactive component, a periodically reset device for combining said components to thereby obtain the maximum demand in terms of KVA, and an accumulating register for registering the total amount of power in terms of KVA.

46. In combination an integrating wattmeter element for power component, an integrating wattmeter element for reactive component, temporary register means for registering the power component over a given period, and means controlled jointly by said wattmeter elements for measuring the power flowing over said period in terms of KVA.

47. In combination an integrating wattmeter element for power component, an integrating wattmeter element for reactive component, temporary register means controlled jointly by said wattmeter elements for registering the power in terms of KVA over a given period, an accumulating register for registering the total amount of power component and means for obtaining a record of said KVA registration.

48. In combination a two dimensional chart having its surface subdivided into unit areas, each of said areas having inscribed thereupon a value of KVA proportional numerically to the distance of the area from the reference point and stepping means controlled by the integrated power flowing in a line cooperating with said chart to select an appropriate one of said areas to indicate power in terms of KVA.

49. In a device of the class described, a two dimensional chart having its surface subdivided into unit areas, said areas having inscriptions of KVA thereupon in accordance with the position of said unit areas on said chart, means responsive to the power flowing in a line for selecting the appropriate one of said areas to indicate power in terms of KVA, and means for periodically recording the selected inscription.

50. In a device of the character described, a rectangular chart subdivided over its entire area into a plurality of unit areas defined by two groups of continuous lines which intersect each other, said areas having inscriptions thereon of KVA, the value of each inscription being the vector sum of the value of the position of the particular unit area along one group of lines and the value of the position of said area along the other group of lines, and means responsive to power flowing in a line for bringing the reference number and the particular unit area which has the proper inscription of KVA into register to indicate the apparent power flowing in the line, said last means being subject to two forces corresponding to the two sets of lines, namely, power component and reactive component.

51. In a device of the character described, a two dimensional chart having its entire surface subdivided into rectangular unit areas by two groups of parallel lines, the lines of each group being at right angles to the lines of the other group, each of said areas having inscribed thereupon a value of KVA, the value of each inscription being a vector sum of the value of the position of the particular unit area along one group of lines and the value of the position of the unit area along the other group of lines, and means acted upon by two forces, namely, integrated reactive component and integrated power component cooperating with said chart to select any appropriate one of said areas to indicate KVA.

52. In a device of the class described, a two dimensional movable chart having a stationary zero point and having its surface subdivided into unit squares by two groups of parallel lines, the lines in each group being at right angles to the lines of the other group, each square having thereupon an inscription of KVA, the value of the particular inscription being in each case the vector sum of the value of the position of the particular square along one group of lines and the value of the position of the said square along the other group of lines with reference to the said zero point, and means respectively responsive to the integrated right angular components of the apparent energy flowing in an alternating current circuit for moving said chart in two directions at right angles to each other to thereby obtain a measure of the vector sum of said components.

53. The method of continuously indicating KVA accumulated over a predetermined period of time or any portion thereof of the electrical power flowing in a conductor by means of a surface divided with respect to a zero point into unit areas by coordinates and provided with graduations on said unit areas in terms of KVA, the value of the graduations in each area being the vector sum of the ordinate of said area and the coordinate of the same area, which comprises—integrating the instantaneous values of the power component of the power flowing in said line in said period or any portion thereof into predetermined units, integrating the instantaneous values of the reactive component of the power flowing in said line in said period or any portion thereof into other predetermined units preferably of equal value with the units of power components, laying out said units of reactive components as they are completed lineally along a coordinate of measurement of said surface, and determining at any time the value of KVA from the graduation of the unit area which is defined in terms of its ordinate by the value of the integrated or accumulated units of reactive components and in terms of its coordinate by the value of the integrated or accumulated units of power component.

54. The method of indicating KVA in a line over a predetermined period of time which comprises, integrating the instantaneous values of power component over said period into predetermined units, simultaneously integrating the instantaneous values of reactive component over said period into similar predetermined units, moving a common indicating element in one direction with reference to a given zero position in response to the predetermined units of one component, and moving the indicating element in a direction that is substantially at right angles to the first direction of movement in response to the units of the second component, and at the end of the period ascertaining the distance of said common indicating element from said zero position in terms of KVA, which is the vector sum of the two classes of units.

In witness whereof, I have hereunto set my hand this 17th day of April, 1923.

RUDOLPH F. SCHUCHARDT.